United States Patent [19]

Younkin

[11] 4,387,304

[45] Jun. 7, 1983

[54] PHASE DEPENDENT SEM IC CHIP TESTING WITH VOLTAGE CONTRAST

[75] Inventor: Douglas R. Younkin, Union, Mo.

[73] Assignee: McDonnell Douglas Corporation, St. Louis, Mo.

[21] Appl. No.: 250,919

[22] Filed: Apr. 6, 1981

[51] Int. Cl.³ .................... G21K 5/10; G01N 23/225; G01R 15/12

[52] U.S. Cl. .............................. 250/492.2; 250/310; 324/158 R; 324/73 AT

[58] Field of Search ...................... 250/397, 492.1, 311, 250/310, 396 R, 396 ML, 492.2; 324/130, 73 R, 324/158 R

[56] References Cited

U.S. PATENT DOCUMENTS 3,678,384  8/1969  Oatley .
3,919,550 11/1975  Banbury .
3,937,959  2/1976  Namae .
3,944,829  3/1976  Sato .

OTHER PUBLICATIONS

Scanning Electron Microscopy for Complex Microcircuit Analysis by John J. Bart, Rome Air Development Center, Reliability Physics Section, Griffis AFB, NY 13441, 16th Annual Proceedings Reliability Physics 1978.
Use of Scanning Electron Microscope for Stroboscopic Voltage Contrast Studies for Electrical Failure Analysis of Dynamic 4096-bit MOS Memory Devices by E. Wolfgang, J. Otto and D. Kantz, INSPEC, Patent Associated Literature S159-760T-D.
Isolation of Potential Contrast in the Scanning Electron Microscope by C. W. Oatley, Journal of Scientific Instruments, (Journal of Physics E), 1979, Series 2, vol. 2.
Specialized Scanning Electron Microscopy Voltage Contrast Techniques for LSI Failure Analysis by Bernard Piwczyk and William Siu, Bell-Northern Research, Ottowa, Ontario, Canada, 12th Annual Proceedings Reliability Physics 1974.

*Primary Examiner*—Alfred E. Smith
*Assistant Examiner*—Jack I. Berman
*Attorney, Agent, or Firm*—Gregory A. Cone; George W. Finch; Donald L. Royer

[57] ABSTRACT

Properties of a dynamically operated integrated circuit (IC) are examined by a nondestructive, noncontact method utilizing a scanning electron microscope such that both logic state information as well as timing information regarding signal propagation delays are presented as contrast differences on the SEM video monitor corresponding to phase conditions on the IC.

3 Claims, 7 Drawing Figures

PHASE DEPENDENT SEM IC CHIP TESTING WITH VOLTAGE CONTRAST

BACKGROUND OF THE INVENTION

1. Field of the Invention

This invention relates to integrated circuit inspection techniques. Still more particularly, this invention relates to the use of scanning electron microscopes for investigating the properties of dynamically operated integrated circuits by utilizing identifiable contrast differences corresponding to phase conditions on the IC.

2. Description of the Prior Art

The use of scanning electron microscopes to investigate variations of potential on the surface of semiconductor integrated circuits was first reported in the late 1950's. Since that time the technique has been widely employed and developed. This technique offers important advantages over alternative methods such as mechanical probing. With reduced geometries and higher densities in the latest semiconductor integrated circuit devices, the physical dimensions of the individual channels on the devices will soon exceed the limits of optical resolution. Indeed, SEM troubleshooting methods may emerge as the only viable technique with which to analyze and inspect such devices.

The most useful SEM methods utilize voltage contrast for IC analysis and fault detection. The phenomenon of voltage contrast in scanning electron microscopy arises due to the fact that the potential of any given location of a specimen being bombarded by an electron beam plays a significant role in the number of electrons being collected by the electron detector within the SEM. A positive specimen bias results in a reduction of the number of electrons collected, while a negative bias has the opposite effect. In general, more negatively biased areas produce a stronger signal than do the more positively biased areas.

One voltage contrast technique utilizes chopping of the incident electron beam probe at a sufficiently high frequency such that several cycles occur while the probe is moving from one picture point to the next. The pulses of current arriving at the detector are amplified and the output is passed to two parallel electric gates, A and B, operated in such a way that alternate pulses travel through separate channels. External bias is applied to the specimen by a square wave voltage whose frequency is half that of the chopping frequency, and whose phase is adjusted so that the signals in channel A come from a biased specimen, while those in channel B originate from an unbiased specimen. The outputs from the two channels are passed through a differential amplifier and the resulting difference signal is lead to the display monitor of the SEM.

Other voltage contrast techniques employ continuous electron beam probes, but each of these methods contain important limitations which restrict their application and effectiveness. There are no prior art voltage contrast SEM techniques known at the present time with continuous electron beam probes which can display both logic state information as well as timing information regarding signal propagation delays expressed as voltage contrasts, differences corresponding to phase conditions on the integrated circuit specimen under test.

SUMMARY OF THE INVENTION

A dynamically operated integrated circuit may be examined utilizing a scanning electron microscope by dynamically operating the IC between two operating states with a logic control means. The electron beam within the SEM continuously scans the IC, and the electrons emitted from the surface of the IC are continuously collected by the detector within the SEM. The output of the detector is presented to one input of a first gate and one input of a second gate. The first gate is enabled by one logic level from the output of the logic control means. The second gate is enabled by the logic control means following the enablement of the first gate. The outputs of the first and second gates are presented to the input terminals of a differential amplifier, the output of which is fed to the SEM display monitor. In one embodiment, timing information regarding signal propagation delay within the dynamically operated integrated circuit device under test is obtained by selectively varying the frequency of the logic control means (a clock). As will be explained in more detail below, if one-quarter clock period is greater than the propagation delay, the observed portion of the IC device will appear bright (or dark, depending on the implemented logic in the specific embodiment). If one-quarter clock period is less than the propagation delay time, the observed portion of the IC under test will appear dark (or bright). If the one-quarter period equals the propagation delay time, the observed portion will appear gray.

DETAILED DESCRIPTION OF THE INVENTION

This invention utilizes a scanning electron microscope (SEM) for noncontact, nondestructive dynamic, die-level troubleshooting of integrated circuit chips. Use of the SEM provides for high magnification and large depth of field capabilities. The technique itself may be more correctly labeled as Phase-Dependent Voltage Contrast (PDVC). The PDVC technique displays logic state information as well as timing information regarding signal propagation delays revealed as contrast differences corresponding to phase conditions at particular areas under investigation on the IC chip.

PDVC is a technique which manipulates the SEM video signal. The particular IC device under test (DUT) is dynamically operated, and the video signal is processed during two selected states of the DUT. During one state, the video signal is inverted and directed to the SEM monitor. During the other state, the video signal is simply directed to the SEM monitor without inversion. During any other states of the DUT (if any), the video signal is blocked. Logic states which are more positive during the time the video signal is inverted than when the video signal is noninverted appear bright. Conversely, those states which are more negative appear dark.

Figure 1:
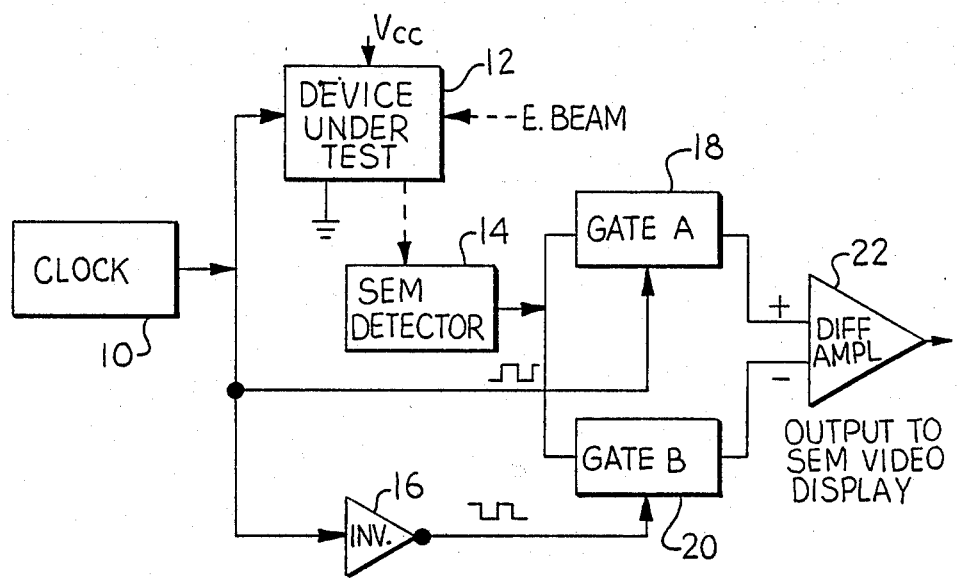
FIG. 1 is a functional schematic block diagram of the video gating circuitry for a two-state IC device.

A block diagram of a simple application of PDVC is shown in FIG. 1. In this embodiment the dynamic operation of the DUT consists of only two states supplied by a clock 10 providing a clock HI and a clock LO signal. Gate A 18 transmits video signals only during clock LO. Gate B 20 transmits video signals only during clock HI. When either gate is in a nonenabled state, the output of that gate is grounded. In the embodiments described herein, the gates are enabled by a logic LO signal. Gate B is enabled during clock HI; but, since the clock signal to the gate B enable input is inverted, the gate is enabled by a logic LO signal. Other blocks in FIG. 1 comprise the device under test (DUT) 12 operated dynamically, the scanning electron microscope detector 14, and inverter 16 which feeds an inverted clock pulse to the enable input of gate B, and a differential amplifier 22. It should be noted that all video information passed by gate B is inverted by the differential amplifier before transmission to the SEM monitor screen.

Logic levels which have just switched more positive (e.g., to +5 v) reduce the sample-to-detector-grid voltage. With this relatively lower potential difference, fewer secondary electrons and reflected primary electrons are collected at the SEM detector, resulting (for non-inverted video signals) in a less bright image for such logic levels. Logic levels which have just switched more negative (e.g., to GND) increase the sample-to-detector-grid voltage, thereby increasing the collection of electrons at the SEM detector and resulting in a brighter image for these logic levels. It is believed that the sample-to-detector-grid voltage variations are directly caused by surface charge changes on the surface of the IC chip under test rather than the logic levels themselves in the areas under observation. If this is the case, a positive voltage logic level will attract and hold a certain surface charge. A change to a more negative voltage logic level will repel these surface charges, thereby increasing the electron flux momentarily. Nevertheless, this mechanism is not completely understood. The above description refers to examination of IC's with the surface oxide intact. Analysis of IC's with the surface oxide removed is also possible with voltage contrast techniques. Conductors with high logic levels (high voltage) will emit less secondary electrons, and conductors with low logic levels (low voltages) will emit more secondary electrons. Though different phenomena are involved when observing voltage contrast images with or without the surface oxide, the technique described here will image the same corresponding contrast (bright/dark) with the same logic levels (low/high) irregardless of the phenomenon observed.

FIGS. 2, 3, 4, 5, and 7 illustrate timing graphs for the situation of an electron beam probe stationary on a DUT metallization stripe. The contrast information can be displayed in a two dimensional image by either a slow scan technique which scans the frame once or a fast scan (TV rate) technique which repeatedly scans the frame. The fast scan technique does not put a restriction on the PDVC clock frequency, but the slow scan technique requires that the electron beam not move appreciably during one clock period.

Figure 2:
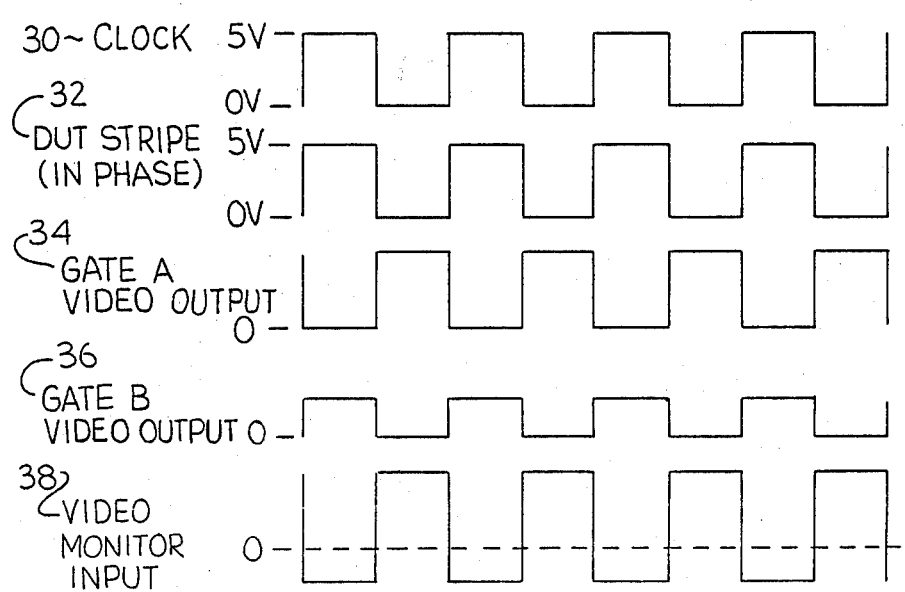
FIG. 2 shows a series of signals at various points in the video circuit of FIG. 1 for which the DUT stripe signal is in phase with the clock pulse.

FIG. 2 shows a series of timing graphs showing the logic levels at various points in the block diagram of FIG. 1. In FIG. 2 each of the graphs has for its abscissa, time, and for its ordinate, dc voltage. Specifically, FIG. 2 shows the operation of PDVC when observing a particular region of a DUT conductor which is in phase with the clock 30. The particular area under observation in this instance is a conductor labeled the DUT stripe. The logic response of this stripe is shown in the second graph 32 which is in phase with the clock logic shown in the first graph 30. The video output signal of gate A is shown in the third graph 34. As was noted above, gate A is enabled only during a logic LO pulse from the clock. Since the clock LO pulse coincides with a more negative logic level at the DUT stripe, the electron flux detected by the SEM detector will be at a maximum in the interval. For clock HI logic levles, gate A is nonenabled and therefore grounded. The video output of gate B is shown in the fourth graph 36. Remembering that this gate, like gate A, is enabled only during a logic LO pulse and also remembering that the clock pulse fed to the enable gate of gate B is inverted, the output of gate B will be nongrounded only during clock HI logic levels. Since the clock HI logic corresponds to the more positive logic level of the DUT stripe, the electron flux detected by the SEM detector will be less in the interval than that detected during the clock LO logic level. The output of the differential amplifier is the same as the video monitor input and is so labeled 38. The output of gate B is inverted at the differential amplifier 22. Since the video monitor input is on the average greater than 0, the DUT stripe will appear as a brighter area on the SEM monitor screen (gray is the neutral contrast condition on the screen corresponding to a 0 video monitor input).

Figure 3:
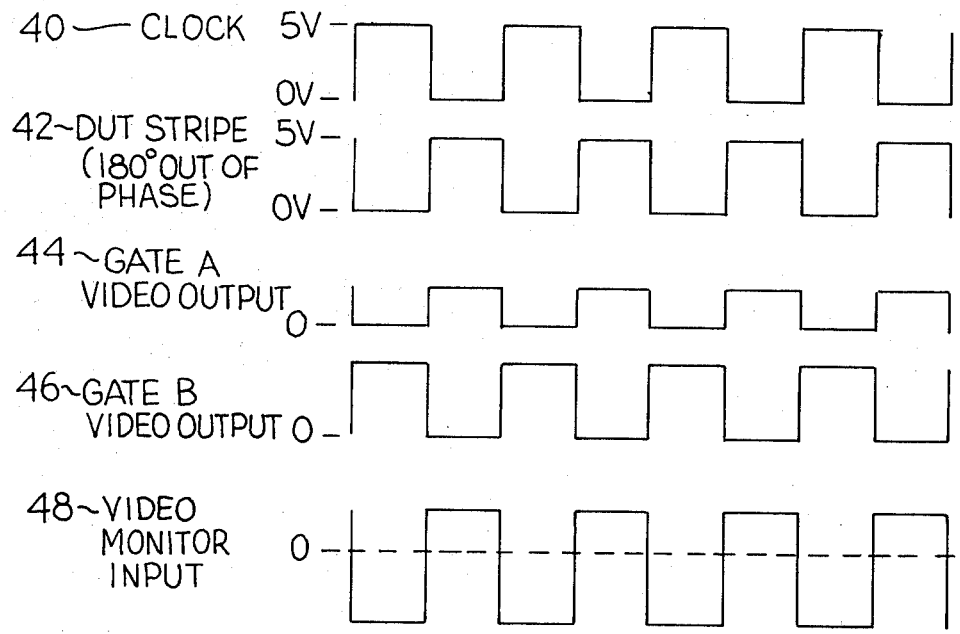
FIG. 3 shows the same signals as FIG. 2 for which the DUT stripe signal is 180° out of phase with the clock pulse.

FIG. 3 shows the logic-timing conditions which occur for a DUT stripe which is 180° out of phase with the clock at the same corresponding points in the block diagram as in FIG. 2. The individual graphs are as labeled the clock logic 40, the DUT stripe logic 42, the video output at gate A 44, the video output at gate B 46, and the video monitor input 48. By the same analysis as above but for, in this case, a 180° out-of-phase signal, the video monitor input is on the average less than 0 and displays a dark contrast image on the SEM monitor screen at the location of the DUT stripe.

Figure 4:
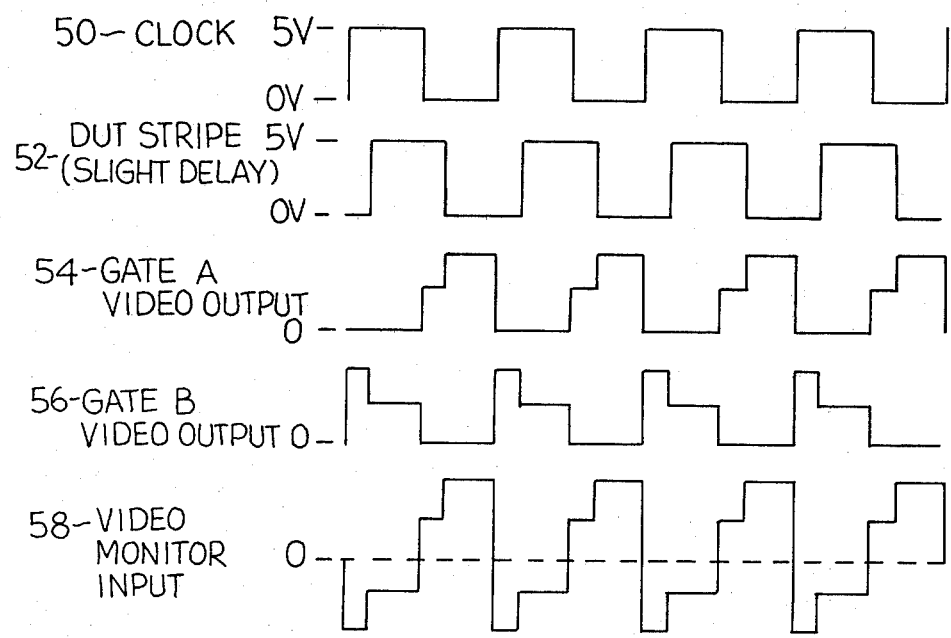
FIG. 4 shows the same series of signals for which the propagation delay is less than one quarter clock period of the clock pulse.
Figure 5:
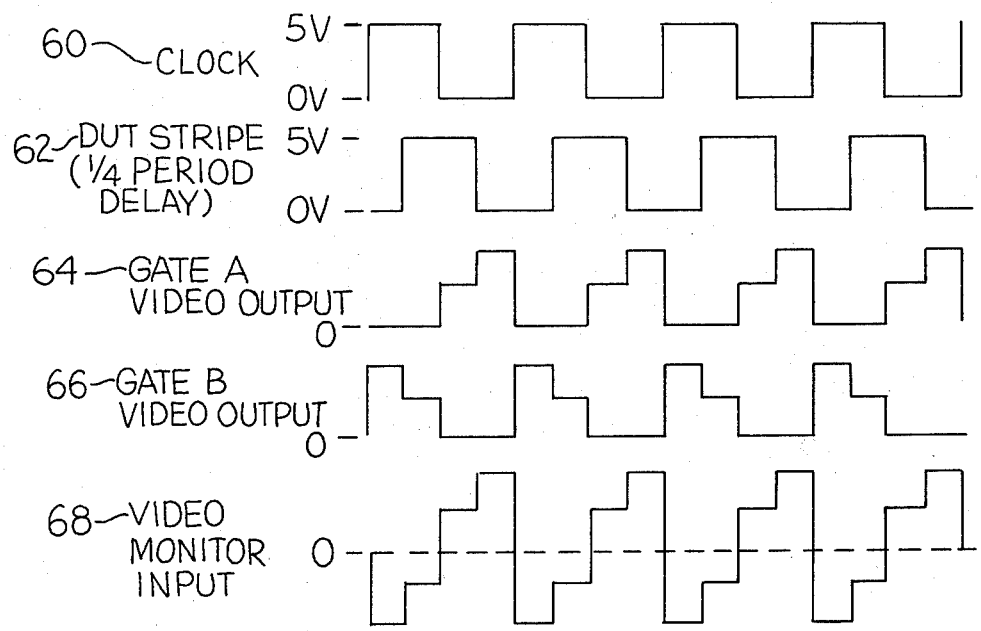
FIG. 5 shows the same series of signals for which the propagation delay is one quarter clock period of the clock pulse.

In the real world, however, signals are not always exactly in phase or 180° out of phase. Propagation delays, turn-on delays, thresholds, all cumulatively delay a signal as it progresses through a device. FIG. 4 shows the signal relationships for a slightly delayed in phase signal (delay less than one-quarter clock period) on a DUT stripe. The video monitor input averages a little less than it did for the device in FIG. 2. Nevertheless, it is still positive and results in an image on the SEM monitor at the position of the DUT stripe which appears bright. As in the corresponding FIGS. 2 and 3, the logic-timing graphs of FIG. 4 are the clock logic 50, the DUT stripe logic 52, the video output of gate A, the video output of gate B 56, and the video monitor input 58.

If the signal delay equals one-quarter of the clock period, the video monitor signal averages to zero. This phenomenon is shown in the logic-timing graphs of FIG. 5. Again, the graphs are the clock logic 60, the DUT stripe logic 62, the video output of gate A 64, the video output of gate B 66, and the video monitor input 68. Examining the video monitor 68, one sees that the signal averages to 0. This DUT stripe will appear gray or of neutral contrast on the SEM video monitor screen.

Summing up the information found in FIGS. 2, 3, 4, and 5, if one-quarter clock period is greater than the access time delay of the DUT stripe, the DUT stripe will appear bright on the SEM monitor screen. If one-quarter clock period is less than the access time delay of the DUT stripe, the DUT stripe will appear dark on the monitor screen. If the access time delay of the DUT stripe is equal to one-quarter clock period, the DUT stripe will appear gray on the SEM monitor screen. Tests with a 5114 complimentary metal-oxide-semiconductor random access memory (CMOS RAM) with an address access delay time of approximately 300 nanoseconds examined with an SEM accelerating voltage of 1.2 kV verified the operability of the PDVC technique.

In the discussion above, the PDVC technique was used with a simple clocking arrangement of the device under test wherein the device switched only between two logic states. The operation of large scale integration (LSI) devices such as microprocessors and the like often requires a sequence of logic states on several input or output lines, each line being independent of all others. Since the PDVC technique will compare only two states of a device, a method for the selection of only two of the desired states must be implemented.

Figure 6:
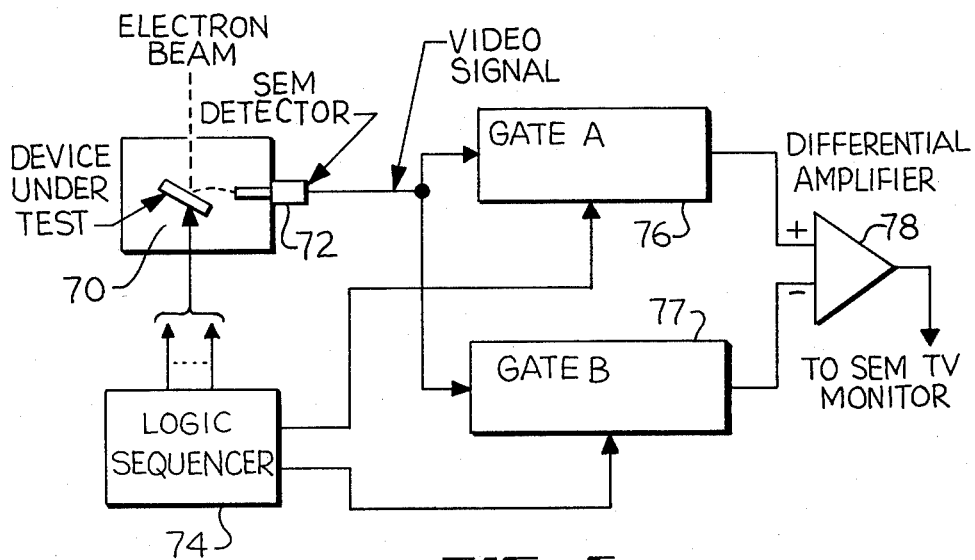
FIG. 6 is a functional schematic block diagram of the technique for a multistate IC device.

By utilizing a different embodiment of the basic PDVC technique, logic level and delay time information may be obtained for a dynamically operated multi-state IC device. In contrast to the PDVC technique described above for a two-state logic device wherein either gate A or gate B will pass a video signal to the SEM monitor at any given point in the signal train, this is a logic sequencer control unit to independently enable gates A and B, each for a (short) time during the pulse sequence. FIG. 6 is a block diagram illustrating the layout of this embodiment of the PDVC.

Figure 7:
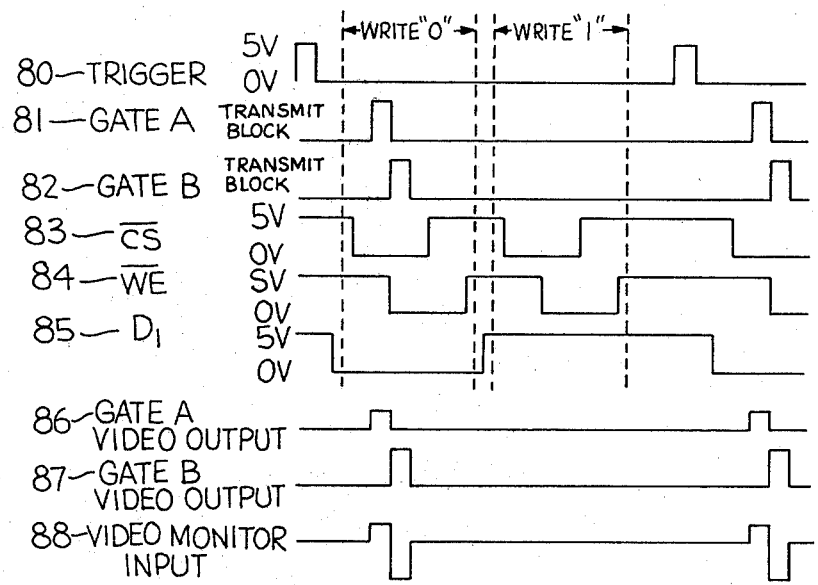
FIG. 7 is a series of graphs showing the various signals as functions of time at different points in the block diagram of FIG. 6.

The dynamically operated device under test (DUT) 70, the SEM detector 72, gate A 76, gate B 77, and the differential amplifier 78 are implemented as in the other embodiment of the PDVC technique. The logic sequencer 74 takes the place of the clock in the previous embodiment in controlling the operation. FIG. 7 displays the response of the system in the block diagram of FIG. 6 at various points in the system. The first graph indicates the trigger function 80 originating from the logic sequencer which is an internal control signal indicating the start of a pulse cycle. This particular figure shows an example of a pulse sequence for a random access memory (MM74C929). The two states being examined here are immediately before and after a logic "0" has been written into a cell which contained a logic "1" previously. Gates A and B are enabled as indicated (transmit) in graphs 81 and 82. Note that the termination of the enablement of gate A is coincident with the initiation of the enablement of gate B. This point of coincidence has been adjusted to coincide for this example with the change in state of the Not Write Enable pulse illustrated in graph 84. The Not Chip Select pulse train in graph 83 and the data in pulse train in graph 85 are also illustrated since these functions, as well as others, would be simultaneously performed on the chip along with the Not Write Enable pulse train of graph 84 since the entire operating system of the IC chip may be dynamically operated and tested concurrently using this technique. The discussion at this point and immediately following will concentrate, however, on the information desired to be obtained from the Not Write Enable DUT stripe under investigation. As such, graphs 86, 87 and 88 correspond to the examination of the behavior of this particular area of the operating IC chip. Graph 86 then displays the video output from gate A. Graph 87 displays the video output from gate B. It should be remembered at this point that since the video output from gate A is sensed during a more positive state of the DUT stripe, the output level in graph 86 will be relatively lower than the output level in graph 87 since the output level in graph 87 is sensed at a relatively more negative state of the DUT stripe. Graph 88 shows the video monitor input after the outputs from gate A and B have been passed through the differential amplifier. Since the video monitor input is on average more negative, the DUT stripe under investigation will appear dark on the SEM TV monitor screen.

Therefore, by appropriate adjustment of the enablement of gate A and the enablement of gate B to coincide with two states of any particular DUT stripe, this PDVC technique will display logic level information to the investigator of the IC device. The investigator may also determine the phase delay between the change in state of the investigated DUT stripe and another separate DUT stripe for a separate logic function by appropriate adjustment of the time of initiation of the enablement of gate B. For example, if one were to investigate the delay time between the already determined Not Write Enable logic state change and the next following logic state change of the Not Chip Select pulse train in graph 83, one would delay the initiation of the gate B enablement by appropriate adjustment to the logic sequencer until, for this example, the Not Chip Select DUT stripe would turn bright on the video monitor TV screen. The time duration of the enablement of gate A should remain equal to the time duration of the enablement of gate B for this procedure. In this example, for the determination of the delay time for the Not Chip Select DUT stripe in relation to the Not Write Enable DUT stripe, this delay time is determined by the necessary delay in the intiation of the enablement of gate B which is marked by a change in contrast on the SEM video monitor screen from gray to bright. This is due to the fact that the Not Chip Select state change goes from relatively more negative to relatively more positive and, as such, will be marked on the screen by a change from gray to bright. However, if the state change had been from a relatively more positive to a relatively more negative level, the state change on the video monitor screen would have gone from gray to dark, as in the original example of the examination of the Not Write Enable state change. In other words, the delay between the state change of the reference pulse to the state change under investigation will be determined by the necessary delay in the initiation of the enablement of gate B to produce a changing contrast on the video monitor screen in the area of investigated DUT strip from gray to either bright or dark, depending on the direction of the logic level change.

I claim:
1. A method of examining timing delays in a dynamically operating integrated circuit (IC) utilizing a scanning electron microscope (SEM) comprising:
dynamically operating the IC between two operating states with a clock means providing a first logic level and a second logic level,
continuously scanning the IC with the SEM, continuously collecting the electrons emitted from the surface of the IC by a detector means in the SEM, presenting the output of the detector to one input of a first gate and to one input of a second gate, enabling the first gate by one logic level from the output of the clock means, enabling the second gate by the same logic level from an inverted output of the clock means, presenting the output of the first gate to one input of a differential amplifier means and the output of the second gate to the second input of the differential amplifier means, presenting the output of the differential amplifier to the SEM display means wherein the timing delay of a change in logic level of an observed area of the IC from a change in logic level of the clock means is determined by examination of the brightness of the observed area relative to unoperated areas of the IC such that maximum brightness contrast occurs at $2nT/4$ and minimum contrast occurs at $(2n+1)T/4$, where T is the clock period and n is an integer.

2. A method of examining a property of a dynamically operating integrated circuit (IC) having at least two operating states utilizing a scanning electron microscope (SEM) comprising:

dynamically operating the IC under the control of a logic sequencer means, continuously scanning the IC with the SEM, continuously collecting the electrons emitted from the surface of the IC by a detector means in the SEM, presenting the output of the detector to one input of a first gate and to one input of a second gate, enabling the first gate by the logic sequencer means for a period of time, enabling the second gate by the logic sequencer means for the period of time such that the second gate is not enabled before the termination of the enablement of the first gate, presenting the output of the first gate to one input of a differential amplifier means and the output of the second gate to the second input of the differential amplifier means, and presenting the output of the differential amplifier to the SEM display means, wherein the property examined is the logical level of an observed area of the IC wherein the enablement of the first gate is terminated not later than a change in logic level of an area of the IC under test and the enablement of the second gate is initiated not earlier than such change, such that the area under test will display a heightened contrast on the SEM monitor relative to non-operated areas of the IC.

3. A method of examining a property of a dynamically operating integrated circuit (IC) having at least two operating states utilizing a scanning electron microscope (SEM) comprising:

dynamically operating the IC under the control of a logic sequencer means, continuously scanning the IC with the SEM, continuously collecting the electrons emitted from the surface of the IC by a detector means in the SEM, presenting the output of the detector to one input of a first gate and to one input of a second gate, enabling the first gate by the logic sequencer means for a period of time, enabling the second gate by the logic sequencer means for the period of time such that the second gate is not enabled before the termination of the enablement of the first gate, presenting the output of the first gate to one input of a differential amplifier means and the output of the second gate to the second input of the differential amplifier means, and presenting the output of the differential amplifier to the SEM display means, wherein the property examined is the timing delay between a change in state of a first logic function in the dynamically operating IC and a change in state in a second logic function of the IC wherein the enablement of the first gate is terminated essentially simultaneously with a change in logic level in the first logic function area of the IC and the initialization of the enablement of the second gate is measurably adjusted to essentially coincide with the same relative change in logic level in the second logic function area of the IC, such that the proper adjustment is marked by an increase in contrast on the SEM monitor of the second area relative to non-operated areas of the IC.

* * * * *

UNITED STATES PATENT OFFICE
CERTIFICATE OF CORRECTION

PATENT NO. : 4,387,304

DATED : 7 June 1983

INVENTOR(S) : Douglas R. Younkin

It is certified that error appears in the above–identified patent and that said Letters Patent are hereby corrected as shown below:

In column 4, line 17, the word [levles] should be <u>levels</u>.

In column 5, line 58, the words [Not Write Enable] should be <u>NOT WRITE ENABLE</u>.

In column 5, line 59, the words [Not Chip Select] should be <u>NOT CHIP SELECT</u>.

In column 5, line 63, the words [Not Write Enable] should be <u>NOT WRITE ENABLE</u>.

In column 5, line 68, the words [Not Write Enable] should be <u>NOT WRITE ENABLE</u>.

In column 6, line 28, the word [Not] should be <u>NOT</u>.

In column 6, line 29, the words [Write Enable] should be <u>WRITE ENABLE</u>.

In column 6, line 30, the words [Not Chip Select] should be <u>NOT CHIP SELECT</u>.

UNITED STATES PATENT OFFICE
CERTIFICATE OF CORRECTION

PATENT NO. : 4,387,304          Page 2 of 2

DATED : 7 June 1983

INVENTOR(S) : Douglas R. Younkin

It is certified that error appears in the above-identified patent and that said Letters Patent are hereby corrected as shown below:

In column 6, line 33, the words [Not Chip Select] should be <u>NOT CHIP SELECT</u>.

In column 6, line 38, the word [Not] should be <u>NOT</u>.

In column 6, line 39, the word [Chip Select] should be <u>CHIP SELECT</u>; the words [Not Write Enable] should be <u>NOT WRITE ENABLE</u>.

In column 6, line 44, the words [Not Chip Select] should be <u>NOT CHIP SELECT</u>.

Signed and Sealed this

Fifteenth Day of May 1984

[SEAL]

Attest:

GERALD J. MOSSINGHOFF

*Attesting Officer*      *Commissioner of Patents and Trademarks*